United States Patent

Ohshima et al.

[11] Patent Number: 5,811,819
[45] Date of Patent: Sep. 22, 1998

[54] ELECTRON BEAM SOURCE AND ITS MANUFACTURING METHOD AND ELECTRON BEAM SOURCE APPARATUS AND ELECTRON BEAM APPARATUS USING THE SAME

[75] Inventors: Takashi Ohshima, Akishima; Hiroyuki Shinada, Chofu; Katsuhiro Kuroda, Hachioji, all of Japan

[73] Assignee: Hitachi, Ltd., Tokyo, Japan

[21] Appl. No.: 568,865

[22] Filed: Dec. 5, 1995

[30] Foreign Application Priority Data

Dec. 22, 1994 [JP] Japan .................................... 6-320188

[51] Int. Cl.$^6$ ...................................................... H01J 37/06
[52] U.S. Cl. ................................ 250/423 R; 250/423 F; 313/310; 313/311; 313/336
[58] Field of Search ............................ 250/423 F, 423 P; 313/336, 310, 311

[56] References Cited

U.S. PATENT DOCUMENTS

| 3,970,887 | 7/1976 | Smith et al. ............................. 313/309 |
| 4,379,250 | 4/1983 | Hosoki et al. ........................ 250/423 F |
| 5,534,743 | 7/1996 | Jones et al. ............................. 313/309 |

FOREIGN PATENT DOCUMENTS

| 5-74333 | 3/1993 | Japan . |
| 5-94762 | 4/1993 | Japan . |
| 5-342983 | 12/1993 | Japan . |
| 6-52788 | 2/1994 | Japan . |
| 7-94077 | 4/1995 | Japan . |

OTHER PUBLICATIONS

Pierce et al., Review of Scientific Instruments, vol. 51, No. 4, Apr. 1980, pp. 478–499.

"Electron and Ion Beam Handbook", Second Edition, (Nikkan Kogyo Shinbunsha (translated), 1986), Edited by Nihon Gakujutsu Shinkokai, No. 132 Committee, pp. 145–151.

Primary Examiner—Jack I. Berman
Attorney, Agent, or Firm—Fay, Sharpe, Beall, Fagan, Minnich & McKee

[57] ABSTRACT

An electron beam source is provided with an electron forming means such as a doped layer of Si for forming conduction band electrons near the surface of the pointed tip of a needle-shaped structure while suppressing emission of electrons from a valence band. The surface of the pointed tip of the needle-shaped structure is formed with a single-crystal semiconductor or insulator. Preferably a surface passivation layer and/or a highly doped layer is formed on the surface of the needle-shaped structure. Also, means for exciting electrons in a valence band may be provided. An electron beam source apparatus and electron beam apparatus incorporating the electron beam source as defined above are also disclosed.

37 Claims, 10 Drawing Sheets

|   |                 | WORK FUNCTION | IMPURITY CONCENTRATION |
|---|-----------------|---------------|------------------------|
| A | CONDUCTION BAND | 3eV           | $1.3 \times 10^{18}$ cm$^{-3}$ |
| B | VALENCE BAND    |               |                        |
| C | CONDUCTION BAND | 4.18eV        |                        |
| D | VALENCE BAND    |               |                        |
| E | CONDUCTION BAND |               | $1 \times 10^{17}$     |

ELECTRON BEAM SOURCE AND ITS MANUFACTURING METHOD AND ELECTRON BEAM SOURCE APPARATUS AND ELECTRON BEAM APPARATUS USING THE SAME

FIELD OF THE INVENTION

The present invention relates to an electron beam source having a high brightness and a narrow energy range suitable for use in an electron microscope. The present invention also relates to a method of manufacturing such an electron beam source.

BACKGROUND OF THE INVENTION

A high-resolution electron microscope generally uses a field-emission electron source having a needle-shaped structure made of tungsten (W). This is described in a handbook entitled "Electron and Ion Beam Handbook", Second Edition (NIKKAN KOGYO SHINBUNSHA (translated), 1986), Edited by NIHON GAKUJUTSU SHINKOKAI No. 132 Committee, pp. 145–151. The electron beam source described in this handbook uses a tungsten cathode with a sharp tip of approximately 100nm. This is done so that a concentrated electric field may be formed to emit electrons from the tip into a vacuum.

Figure 3A:
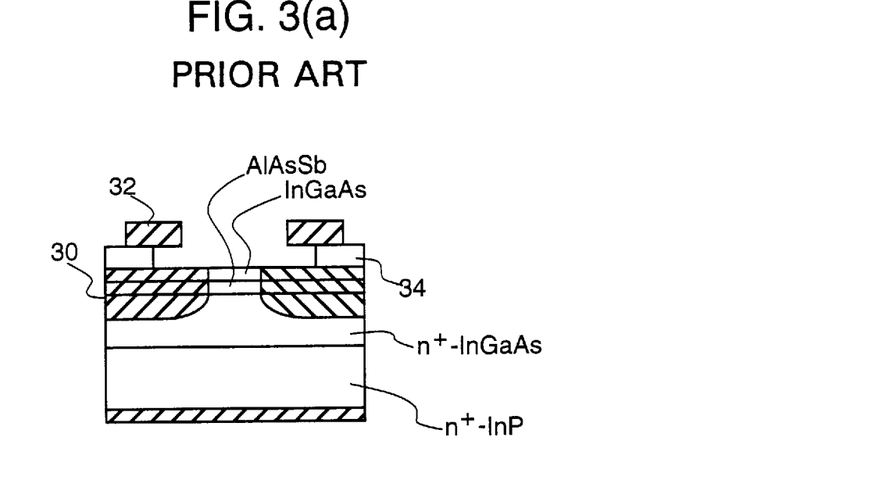
FIG. 3(a) is a sectional view of another conventional electron beam source.

An example of a publication disclosing an electron beam source using a semiconductor material is Japanese Patent Laid-open No. 74333(1993). As shown in FIG. 3(a), such a beam source is formed by using a double barrier structure to obtain a monochromatic electron beam by extracting only a specific energy component out of the conduction band in accordance with the resonant tunnel effect. Structurally, a quantum well layer made of an InGaAs layer and a barrier layer made of an AlAsSb layer are formed on the surface, and hence a quantum well is sandwiched by insulated regions to form a double barrier structure.

Figure 3B:
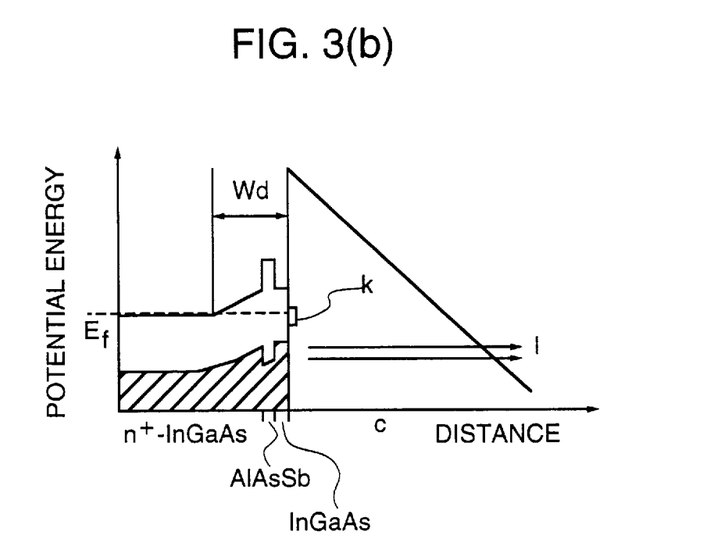
FIG. 3(b) illustrates an explanation of the theory of operation of the electron beam source of FIG. 3(a).

In FIG. 3(a), numeral 30 represents an insulating region, numeral 32 represents an electrode and numeral 34 represents an insulating film. FIG. 3(b) illustrates a graph of potential energy versus distance. In this figure, Wd is a depletion region, $E_f$ is the Fermi level, and c represents a vacuum region. An l is used to represent electrons which are emitted. A k is used to indicate a surface state.

SUMMARY OF THE INVENTION

Figure 2A:
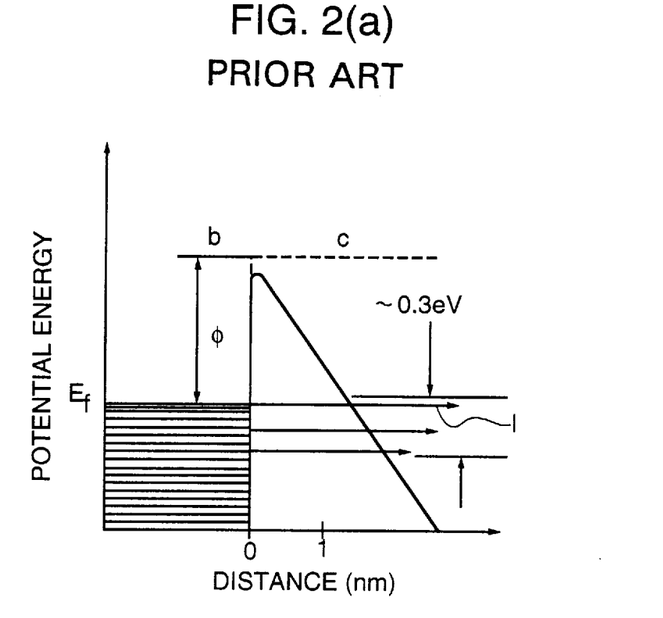
FIG. 2(a) illustrates an explanation of the theory of operation of a conventional electron beam source.
Figure 2B:
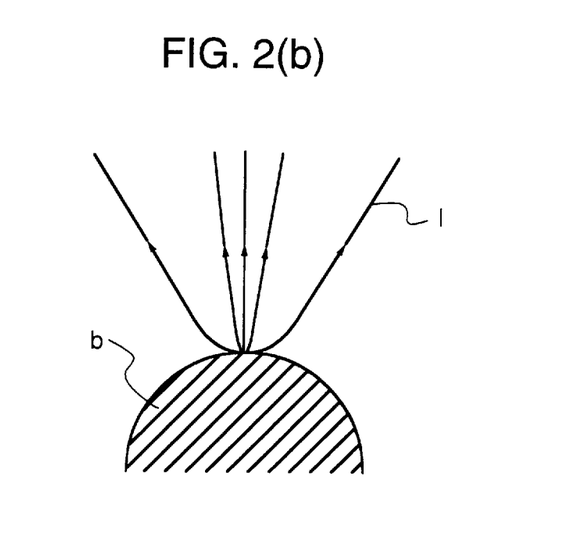
FIG. 2(b) is a partial sectional view of a conventional electron beam source.

The electron beam sources in the prior art suffer problems which the present invention overcomes. First of all, a conventional field-emission electron source has an energy range in a strong electric field of approximately 0.3 eV or higher, depending upon the tunnel probability in the vacuum-level triangular potential generated due to the electric-field concentration. This also depends upon the electron distribution in the tungsten (W) cathode that is used as shown in FIG. 2(a). This is because the range from a Fermi surface potential ($E_f$) up to a portion at several eV below, in a metal, is continuously filled with electrons. This makes it very difficult to improve the monochromatic property of the electron beam source. The monochromatic property referenced above implies an electron beam with a narrow band of energies. Additionally, there is another problem in that it is difficult to converge electron beams extracted by the electric field because electrons near the Fermi surface have a large momentum and as a result the velocity distribution perpendicular to the direction of electron emission becomes large as shown in FIG. 2(b).

FIG. 2(a) is a graph plotting energy versus distance in which b represents the W cathode region and c represents a vacuum region. An 1 is used to identify emitted electrons. The Fermi level $E_f$ and the work function $\phi$ are also shown. In FIG. 2(b), b represents the W cathode and l represents the path of an emitted electron.

While a monochromatic electron beam is said to be obtainable in Japanese Patent Laid-Open No. 74333/1993, two problems were found. Due to the planar structure of the electron beam source produced by providing an InGaAs layer sandwiched by insulating layers, it is difficult to obtain an electric field strong enough for electron emission. Even if an electric field of sufficient strength is obtained, emission of conduction band electrons, which are needed for a monochromatic beam, is restrained and more electrons are emitted from the valence band. A sufficient amount of monochromatic electrons cannot be obtained because the potential energy of the semiconductor surface increases due to the semiconductor surface states and a depletion region (Wd) is formed.

Additionally, similar problems were found in other needle-shaped field emission electron sources disclosed in Japanese Patent Laid-Open Nos. 342983/1993, 94762/1993 and 94077/1995. These sources use an n-type semiconductor, n-type Si and n-type diamond, respectively, in order to emit electrons from the conduction band. However, they do not discuss carrier densities. Thus, it is difficult to obtain a monochromatic beam because of the existence of surface states.

In view of the foregoing problems in the prior art as identified by the present inventors, the present invention has resulted with the following objects, features and advantages.

Accordingly, it is a first object of the present invention to provide an electron beam source capable of generating an electron beam with a small energy width and high-brightness.

A second object of the present invention is to provide a method for manufacturing such an electron beam source according to the first object of the present invention.

A third object of the present invention is to provide an electron beam source apparatus incorporating the electron beam source according to the first object of the present invention.

Finally, it is a fourth object of the present invention to provide an electron beam apparatus incorporating the electron beam source apparatus according to the third object of the present invention.

In order to achieve the first object of the present invention, the electron beam source includes a needle-shaped structure having a pointed tip with its surface made of a single-crystal semiconductor or single-crystal insulator. The electron beam source also includes electron forming means for forming conduction-band electrons near the tip surface of the needle-shaped structure.

The electron forming means may include an n-type region on a part of or on the whole of the needle-shaped structure. An n-type impurity doped layer having a concentration exceeding the surface state density in a band gap may be formed on the tip surface of the needle-shaped structure. The electron forming means may also include some means for exciting valance-band electrons, where such means may be a photoexcitation means.

The surface of the needle-shaped structure may be made of a single-crystal semiconductor or a single-crystal insulator. A surface state decreasing means may be provided on the tip surface of the needle-shaped structure in order to lower the surface state in a band gap formed on the tip surface of the needle-shaped structure.

The surface state decreasing means can be a surface passivation layer made of a material capable of controlling the number of surface states to approximately one per 1,000 surface atoms or fewer. Such a surface passivation layer may be made of chalcogens, hydrogen, or a compound of chalcogens and hydrogen. Preferably, the amount of the element or compound forming the surface passivation layer is determined so that the number of surface states in a band gap approaches one per 1,000 surface atoms or fewer.

Also, the surface state decreasing means can be a reconstructed layer of surface atoms. In particular, when using a single-crystal semiconductor for the needle-shaped structure, it is preferable that the deviation of electron emission is within 20 degrees from a line perpendicular to the {110}-plane of the crystal. This is because the surface reconstructed layer formed during surface cleaning causes most surface states to be removed out of the band gap. Preferably, an n-type impurity doped layer is formed which exceeds the surface state density in a band gap formed on the tip surface of the needle-shaped structure.

Additionally, to achieve the first object of the present invention, the pointed tip of the needle-shaped structure has its surface made of at least one type of group IV semiconductor such as a single-crystal Si or a mixed crystal of group IV semiconductors such as Si-Ge. This surface also includes impurities having a density exceeding the effective state density in a conduction band. A surface state decreasing means may be provided on the tip surface of this needle-shaped structure. Such a surface state decreasing means may be a surface passivation layer made of chalcogens as discussed above.

All of the electron beam sources above may be provided with a surface adsorbed layer on the needle-shaped structure in order to lower the surface state in a band gap. Such a surface adsorbed layer may include at least one type of material selected from a group including Cs, TiO, HfO, ThO, VO, NbO, YO, ScO, MgO, ZrO, AlO, BeO, CeO, CsO, TiN, ZrN, HfN, VN, NbN, YN, MgN, and AlN. The surface adsorbed layer lowers the work function.

Preferably, the surface adsorbed layer is arranged so that the work function of the surface is less than or equal to 2.5 times the band gap formed on the tip surface of the needle-shaped structure. The work function of the surface may approach zero as well. According to a preferred embodiment, the surface adsorbed layer is arranged such that the work function of the surface of the layer is 1eV or higher. The greater the work function is with respect to the band gap, the greater the distance between the conduction band and the valence band. The increased separation between the conduction and valence bands enables many conduction band electrons to reach an object while many valence band electrons cannot.

For all of the electron beam sources discussed above, at least one set of layers including a quantum well layer and a barrier layer formed inside the quantum well layer may be formed in the tip of the needle-shaped structure.

In order to achieve the second object of the present invention, the electron beam source manufacturing method includes the steps of preparing a needle-shaped structure having a pointed tip with its surface made of a single-crystal semiconductor or single-crystal insulator. A surface passivation layer is formed for lowering the surface state in a band gap formed on the tip surface of the needle-shaped structure. The surface passivation layer is formed by dipping the needle-shaped structure into a solution containing an element forming the surface passivation layer. Alternatively, the solution containing an element forming the surface passivation layer may be applied onto the needle-shaped structure or deposited onto the needle-shaped structure by vacuum evaporation or chemical vapor deposition.

In order to achieve the third object of the present invention, the electron beam source apparatus employs any one of the electron beam sources discussed above. Additionally, a positive electrode is provided adjacent to the electron beam source. A means for applying a negative voltage to the electron beam source against the positive electrode is provided in order to cause electrons to be emitted from a conduction band of the electron beam source and into a vacuum. When the electron beam source apparatus has a surface adsorbed layer made of Cs, for example, it is preferable to use some means for supplying a material forming the adsorbed layer. In such a case, the electron beam source is preferably placed in a vacuum atmosphere of $10^{-7}$ Pa or lower.

To achieve the fourth object of the present invention, the electron beam apparatus according to the present invention employs an electron beam source apparatus having any one of the electron beam sources discussed above. Additionally, an acceleration electrode is provided for accelerating electrons emitted from the electron beam apparatus. At least one control electrode is provided for controlling the accelerated electrons.

These and other objects, features, and advantages of the present invention will become more apparent in view of the following detailed description.

DETAILED DESCRIPTION OF THE PREFERRED EMBODIMENTS

In order to obtain an electron beam source with high brightness and a narrow energy range, it is necessary to selectively emit electrons from a specific band in a vacuum. Accordingly, a material having a band with a small energy distribution of electrons and a small momentum near a Fermi surface is needed.

Figure 4A:
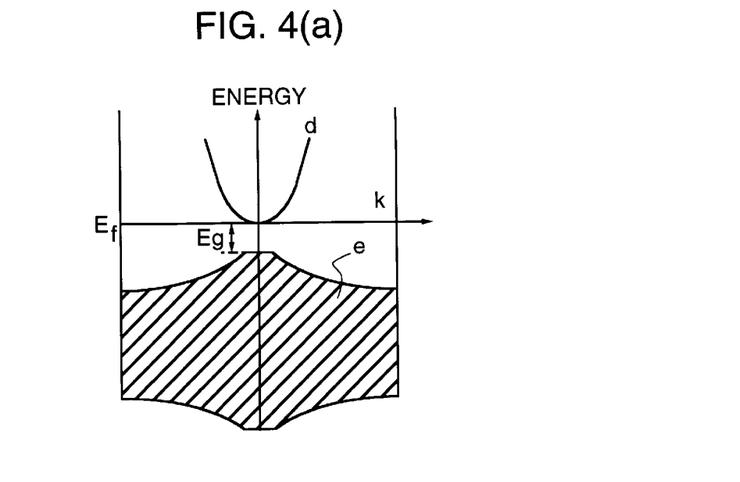
FIGS. 4(a)–4(c) illustrate the theoretical operations of the electron beam source according to the present invention.

As shown in FIG. 4(a), a single-crystal semiconductor or insulator has a small distribution of electrons in a conduction band and a Fermi level near a forbidden band. Therefore, by using this type of material to form a needle-shaped electrode and applying a strong electric field, an electron beam of 0.1 eV or lower with a very high monochromatic property is obtained. FIG. 4(a) is a graph illustrating a band structure in which energy is plotted on the vertical axis. An energy gap $E_g$ is shown to exist between the conduction band (d) and the valence band (e). The Fermi level is shown as $E_f$. Letter k represents the momentum of the electrons in the solid. The kinetic energy distribution perpendicular to the direction of electron emission is proportional to the square root of the Fermi energy according to the free electron approximation. The value is one place smaller than that in metal.

The wavelength of an electron wave in a semiconductor is longer than several times the wavelength in a vacuum. Thus, the traveling direction of an electron is refracted at the interface between the semiconductor and the vacuum and approaches the perpendicular line representing the interface. For these reasons, electrons emitted from a conduction band in a semiconductor travel substantially in a straight line in a vacuum. As a result, an electron beam with high brightness can be expected.

Accordingly, in order to form a high performance electron beam source, an n-type semiconductor may be used as the electron beam source. However, due to the presence of surface states in a band gap on the surface of the semiconductor, the surface potential is increased by an amount $E_b$ on the surface as opposed to the remaining portion of the semiconductor, as shown in FIG. 4(b).

Figure 4B:
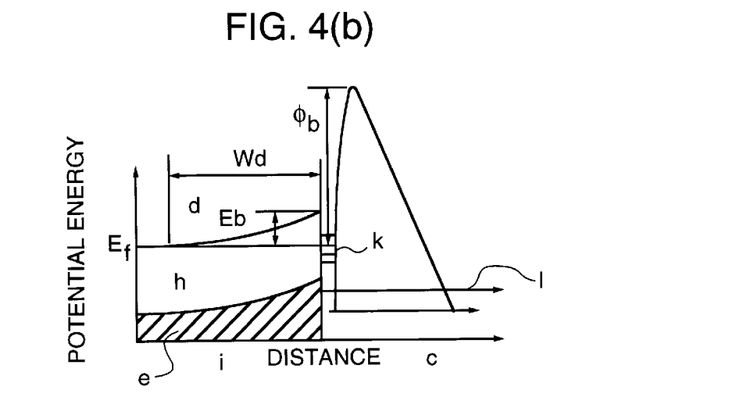
Figure 4C:
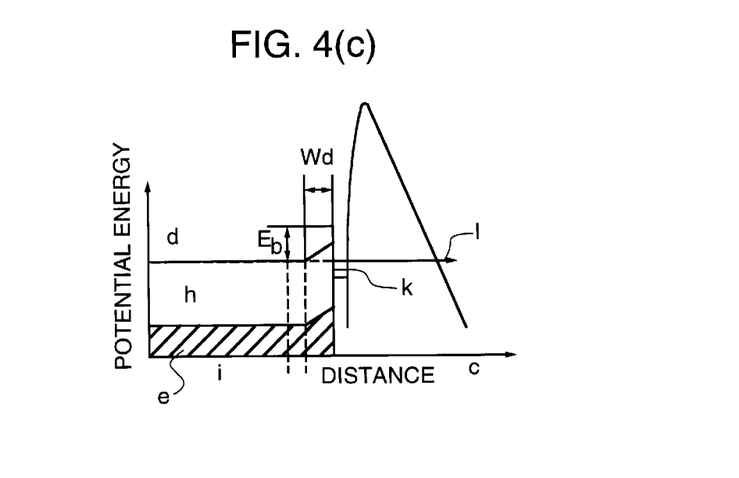

FIGS. 4(b) and 4(c) plot potential energy against distance. In these figures, d represents the conduction band and e represents the valence band just as in FIG. 4(a). Also, Wd represents a depletion region, $E_b$ represents the increase in surface potential due to surface states, k represents the surface states, l represents an emitted electron, h represents a forbidden band (located between the valence and conduction bands), region i represents the n-type semiconductor region, region c represents the vacuum region, and $\phi_b$ represents the work function. As shown in FIG. 4(b) due to the large depletion region Wd, electrons are mostly emitted from the valence band and almost none from the conduction band. However, if an n-type impurity doped layer exceeding the surface state density in the band gap is formed at a position several nanometers away from the surface, then the depletion region Wd becomes very thin and electrons from the conduction band can easily pass through the surface due to the tunnel effect, as shown in FIG. 4(c).

Furthermore, by forming a surface passivation layer or a reconstructed surface layer, the surface state in the band gap decreases even further and the depletion region effectively disappears. Thus, a highly monochromatic and high brightness electron beam source with an energy half-width of approximately 0.1 eV or lower can be obtained.

Figure 6A:
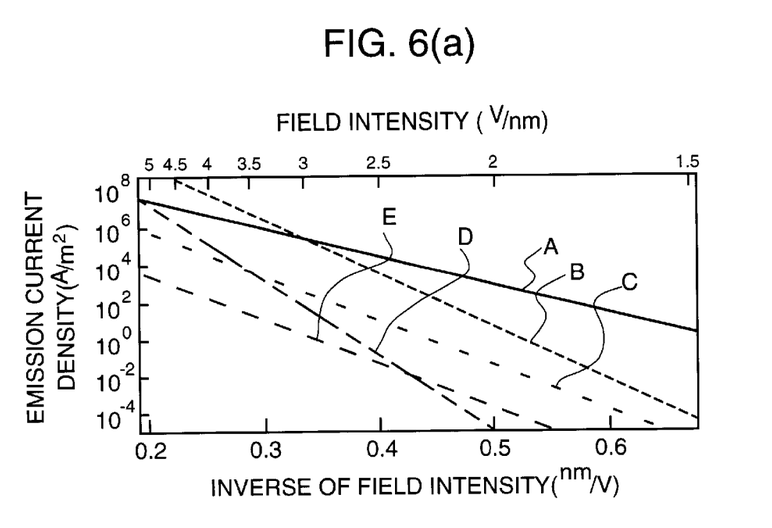
FIGS. 6(a), 6(b), and 6(c) illustrate the relationship between emission current density and field intensity.

FIG. 6(a) illustrates the relationship between emission current density (A/m$^2$) and field intensity (V/nm), in the case of GaAs, as well as the inverse of the field intensity. Lines C, D and E represent a relationship which exists in a vacuum in which an n-type GaAs material has a work function of 4.18. Line D shows the current emitted from the valence band and line C illustrates the current emitted from the conduction band, when the impurity density is $1.3 \times 10^{18}/$cm$^3$. The current has an impurity dependence as shown by line E when the impurity density is $1 \times 10^{17}$/cm$^3$. When the work function is decreased to 3, the current emitted from the conduction band and the valence band are shown by lines A and B, respectively.

Figure 6B:
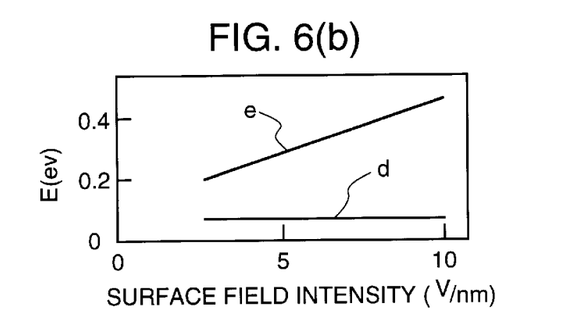

FIG. 6(b) illustrates the relationship between the electron beam energy half band width (eV) and the surface field intensity (V/nm) in a vacuum. The impurity concentration is $1.3 \times 10^{18}$/cm$^3$. Letter d represents the conduction band while letter e represents the valence band.

Figure 6C:
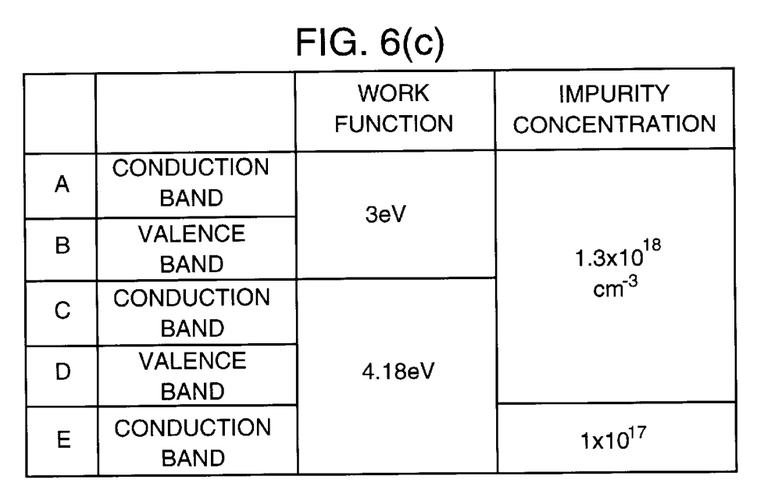

FIG. 6(c) is a table defining what lines A, B, C, D and E represent when used in FIG. 6(a).

Figure 5A:
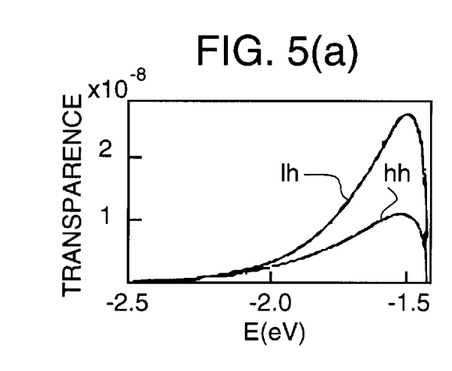
FIGS. 5(a)–5(f) show various graphs illustrating the operation of the electron beam source according to the present invention.
Figure 5B:
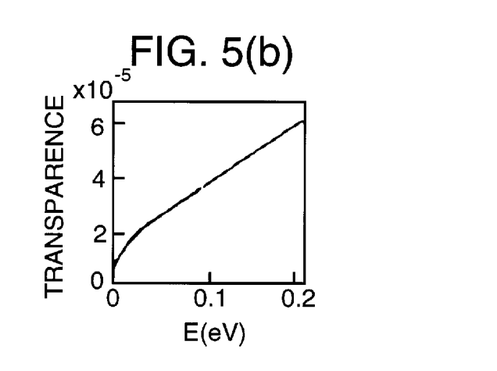
Figure 5C:
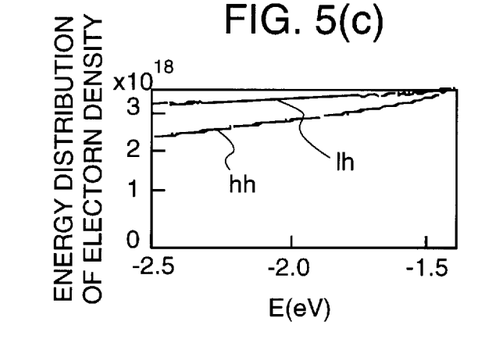
Figure 5D:
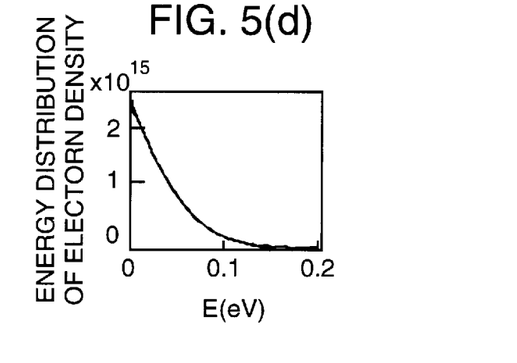
Figure 5E:
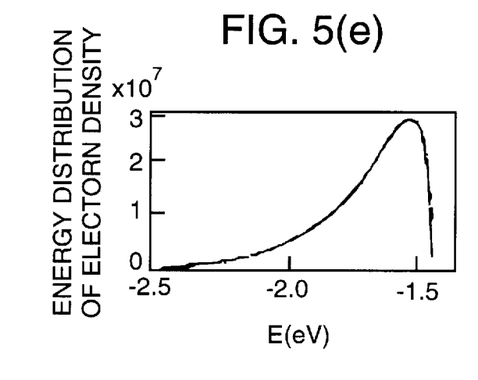
Figure 5F:
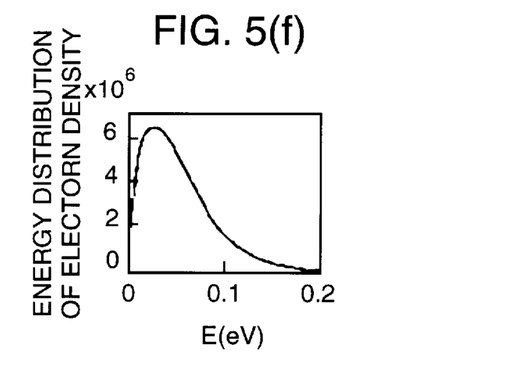

Next, the graphs shown by FIGS. 5(a)–5(f) will be discussed in more detail. Transparence for the valence and conduction bands are illustrated in FIGS. 5(a) and 5(b), respectively. Similarly, energy distribution of the electron density for the valence and conduction bands are illustrated in FIGS. 5(c) and 5(d), respectively. Finally, the emission current energy distribution for the valence and conduction bands are shown in FIGS. 5(e) and 5(f), respectively.

Due to the presence of a band gap between the valence band and the conduction band, the height and depth of a barrier through which electrons pass are different for each of these bands. As a result, the transparence of the valence band (FIG. 5(a)) is smaller than that of the conduction band (FIG. 5(b)), due to the tunnel effect. However, as shown in FIGS. 5(c) and 5(d), the electron density of the valence band is much larger than that of the conduction band. The energy distribution of an emission current that is determined by the electron density and the transparence is shown in FIGS. 5(e) and 5(f). If the field intensity is increased to obtain a large current, the tunnel barrier becomes thin and emission of electrons from the valence band becomes dominant. This is shown by lines C and D in FIG. 6(a). As shown in FIG. 5(e), the energy range of the electrons emitted from the valence band is 0.2 eV or higher. As illustrated in FIG. 6(b), if the field intensity is strengthened in order to extract more current, the energy range increases to approximately 0.4 eV. Also, because the valence band is filled with electrons, as shown in FIG. 4(a), the momentum distribution perpendicular to the electron emitting direction may be as wide as several eV, thus lowering the brightness of the electron beam. Therefore, by forming a layer for decreasing the work function on the surface of the electron beam source, it is possible to decrease the ratio of the work function to the band gap. It is also possible to restrain field emission from the valence band even in a larger current region, as shown in FIG. 6(a), and obtain a monochromatic beam having high brightness from the conduction band. This result is more prominent when the work function is approximately 2.5 times the band gap of the semiconductor or smaller. In FIGS. 5(a) and 5(c), lh and hh represent a lightweight hole and a heavy hole, respectively.

Figure 1A:
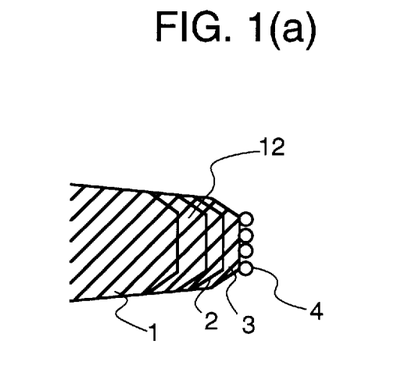
FIG. 1(a) is a partial sectional view of the electron beam source of the first embodiment of the present invention.

FIG. 1 illustrates a sectional view of a first embodiment of the electron beam source of the present invention. As shown in FIG. 1(a), a single-crystal GaAs film 12 having a thickness of 5 nm is grown near the tip of a needle-shaped structure 1 of a high concentration n-type single-crystal GaAs substrate oriented in the <100> by molecular beam epitaxy (MBE). A doped layer 2 made of Si is formed on the film 12 as a high surface concentration impurity layer at a concentration of $10^{13}/cm^2$. Finally, a 2-nm GaAs layer 3 is grown on the doped layer 2 to produce a laminate. Then, the laminate is brought into a vacuum device in which its surface is cleaned in an As vapor of approximately $10^{-7}$ Torr at 540° C. for 5 minutes. Thereafter, a surface passivation layer 4, made of a monatomic Se layer, is deposited onto the surface of the laminate. This surface passivation layer acts as a surface state decreasing means.

Figure 1B:
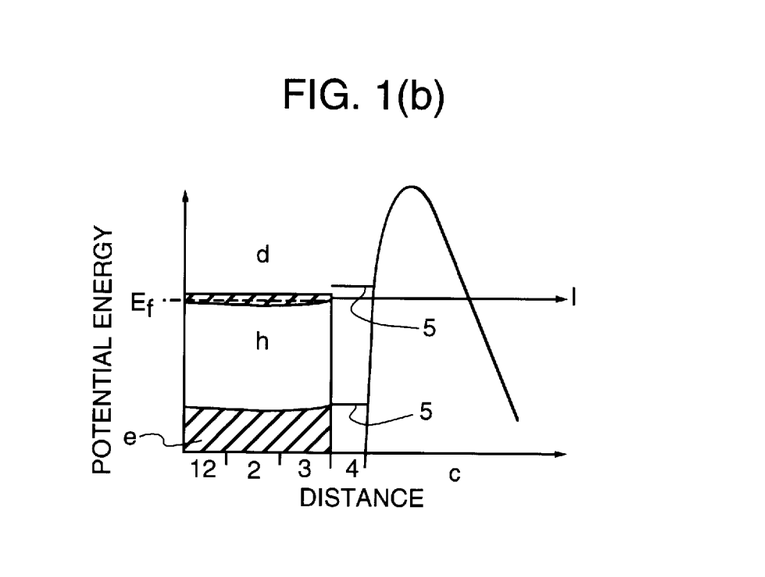
FIG. 1(b) illustrates an explanation of the theory of operation of the electron beam source of the present invention.

As shown in FIG. 1(b), a molecular orbit 5 is produced as a result of Se adsorption and is present near the circumference of the forbidden band. Thus, the surface states in the forbidden band move into the conduction or valence bands and the increase of surface potential is restrained. An electron beam with an extremely narrow energy range, as shown in FIG. 5(f), may be obtained when a negative voltage is applied to the facing anode such that the electric field near the tip becomes approximately 3 to 5 V/nm. This energy range becomes approximately 70 meV at room temperature.

FIG. 1(b) is a graph plotting potential energy versus distance. The reference numerals used in FIG. 1(b) are similar to there use elsewhere in the specification. Specifically, the Fermi level is shown as Ef, l represents an emitted electron, d represents the conduction band, h represents the forbidden band, e represents the valence band, numerals 2–4 and 12 represent regions corresponding to those on the electron beam source of FIG. 1(a), 5 is a molecular orbit, and c represents a vacuum region.

In the above described embodiment, Se is used as the surface state decreasing means. However, the same effect may be obtained using chalcogens of S or the like, hydrogen, or a compound of Se, S, and hydrogen instead of Se. Also, these adsorption substances can be formed by applying solutions of ammonium-sulfide (($NH_4)_2S$), sodium hydrogen sulfide, or sodium sulfide to the surface of the electron beam source in addition to applying the surface state decreasing means by steam or by dipping. The surface depletion region may be made to disappear by controlling the number of surface states to 1 per 1000 surface atoms or fewer.

In addition to the above mentioned materials, other elements or compounds may be used for forming the surface passivation layer as long as such a material can control the number of surface atoms to 1 per 1000 or fewer.

The orientation <100> is selected as the electron emitting direction because such a crystal is easily grown. However, when another orientation <110> is selected, there is the advantage that most surface states are removed from a band gap due to a reconstructed layer of surface atoms that are produced when the surface is clean. Thus, a surface passivation layer is unnecessary. This effect increases as the region of the plane (110) expands in the electron emitting plane. Accordingly, it is preferable to set the direction of electron emission within a range of 20° from the orientation <110> and more preferably within 5° from the orientation <110>.

Although the present embodiment has been disclosed using n-type GaAs as the material forming the electron beam source, the same effect can be realized by using other group III–V compound semiconductors such as AlAs and AlGaAs mixed crystal or InGaAsP mixed crystal. Also, a group II–VI compound semiconductor such as high-concentration n-type ZnSe or ZnS, a group IV semiconductor such as n-type Ge, Si-Ge, or Si, or an insulator such as diamond may be used instead of the n-type GaAs. In the case of an indirect-transition semiconductor such as Ge or Si, an electron beam can be made to travel adequately straight by selecting the orientation of a valley where the electrons collect as the electron traveling direction. This advantageously improves the resolution of the electron microscope when the beam is applied to the microscope.

Since a material such as Si has a high effective-state density in the conduction band, if a material with a high impurity concentration exceeding that of Si is used, the surface state decreasing means is unnecessary. It also becomes unnecessary to form a high-concentration impurity layer because such a layer is already present as a whole. Additionally, as discussed above, a surface passivation layer may be formed on a monatomic layer of chalcogens such as Se, hydrogen, or a compound of chalcogens and hydrogen.

Although the present embodiment has been disclosed using a semiconductor, a metal or a semi-metal can be used for the needle-shaped structure 1 which serves as the base material of the electron beam source. If this is done, the electron beam source will have more current because of the lower resistance of the metal or semi-metal. For example, with a base of single-crystal NiAl, a high-doped n-type single-crystal GaAs can be grown. On the other hand, with a base of singlecrystal $CoSi_2$, single-crystal Si or Ge can be grown. Even if an insulator such as single-crystal $CaF_2$ or SiC is used, a similar effect may be obtained by using a structure that supplies electrons to a conduction band. In such a case, another advantage is realized in that the structure is capable of withstanding a large current density because an insulator is more heat-resistant than a semiconductor.

Additionally, although MBE is disclosed as the method for growing crystals, any other method such as chemical vapor deposition (CVD) including MOCVD (Metal-Organic CVD) or LPCVD can be used as long as such methods are able to form a single-crystal thin film.

Figure 9:
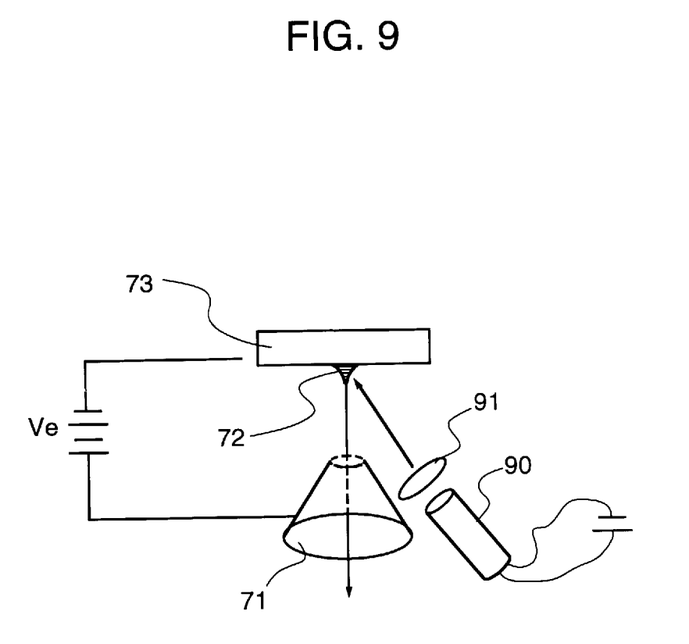
FIG. 9 illustrates an electron beam source apparatus according to the first embodiment of the present invention.

Although the means for supplying conduction-band electrons near the surface is a high-concentration doped layer, such means can be accomplished by exciting electrons in a valence band by using light or the like, thereby exciting the electrons from the valence band into the conduction band. Such an implementation is shown in FIG. 9. According to FIG. 9, an emitter 72 is set on a substrate 73. A conical anode 71 is provided opposite the emitter 72. Light is applied to the emitter 72 from a laser diode 90 through a focusing lens 91. A potential Ve is applied across the electrodes. An inter-band transition of electrons in the semiconductor is induced upon application of the light and the number of electrons in the conduction band increases. Preferably, a p-type single-crystal GaAs substrate is used because it is more effective than an n-type single-crystal GaAs substrate. Ultraviolet radiation may also be used if its energy is large enough to induce the inter-band transition. Also, light may be applied from the back of the substrate if desired. The intensity of the resulting electron beam can be adjusted by adjusting the intensity of the applied light.

Although no surface work function decreasing means is disclosed in this embodiment, a larger current may be obtained by forming a surface adsorbed layer. The surface adsorbed layer may be a monomolecular layer made of Cs, TiO, HfO, ThO, VO, NbO, YO, ScO, MgO, ZrO, AlO, BeO, CeO, CsO, TiN, ZrN, HfN, VN, NbN, YN, MgN, and AlN on the GaAs layer 3 and setting the work function to a value approximately equal to or less than 2.5 times the band gap of the semiconductor without forming the surface passivation layer 4. In order to obtain an electron beam source having a high brightness, the surface work function is preferably leV or higher because it is necessary to concentrate an electric field onto the tip of the electron emitting source. Therefore, in case an extremely low work function adsorbate such as Cs or CsO is used, the thickness of the adsorption layer which is thinner than a monolayer is desirable and 0.1 to 0.5 molecular layers are preferable. Additionally, it is also possible to form the surface adsorbed layer on the surface passivation layer 4.

While the present embodiment has been disclosed using a single-crystal semiconductor as the base material for the electron beam source, a more monochromatic electron beam may be obtained by using a hetero-structure for the electron beam source and using a quantum well layer and a barrier layer inside of the quantum well layer. In other words, a highly-doped, n-type, single-crystal GaAs is used for the needle-shaped structure 1 of the electron beam source of FIG. 1. A layer of AlAs is formed to a thickness of 1.5 nm between the needle-shaped structure 1 and the single-crystal GaAs film 12 as a barrier layer. Then, by using the doped layer 2, the GaAs layer 3, and the surface passivation layer 4, a double barrier structure is obtained.

The double barrier structure is obtained by combining the above mentioned structure with the barrier layer formed in accordance with a vacuum level in a strong electric field. It is possible to extract only electrons with an energy level equal to the quantum level produced in a quantum well. Thus, an electron beam of 20 to 30 meV at room temperature and 5 to 6 meV at the liquid nitrogen temperature having high monochromatic property is obtained. The barrier layer is thinner than the penetration length of an electron wave and preferably is in a range of 0.5 to 10 nm.

Other materials such as a group III–V compound semiconductor, a group II–VI compound semiconductor such as ZnSe or ZnS, a group IV semiconductor such as Ge or Si, or a semiconductor/insulator, or a material capable of forming a double barrier structure such as a metal or semiconductor, are also used to obtain monochromatic electron beams.

Figure 7A:
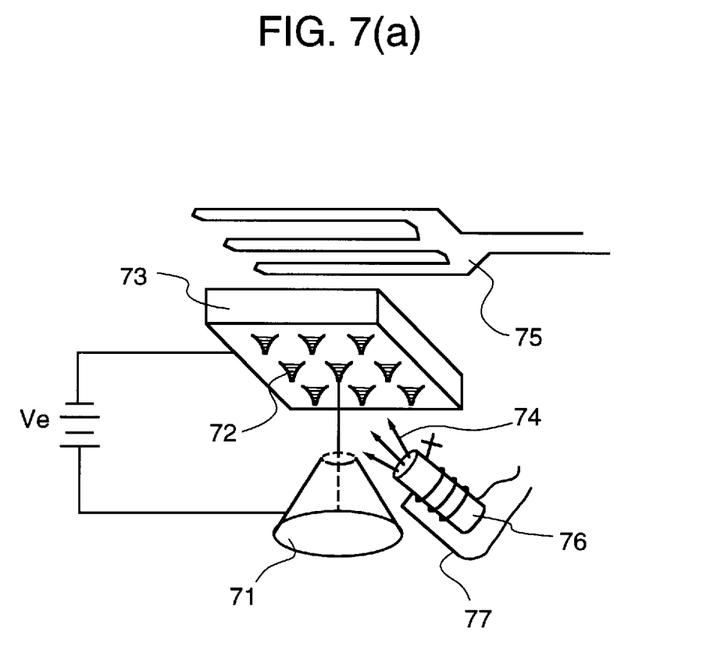
FIGS. 7(a) and 7(b) illustrate an electron beam source apparatus according to a second embodiment of the present invention.

According to another embodiment of the present invention, an electron beam source apparatus is shown in FIG. 7(a). A highly-doped n-type GaAs substrate 73 oriented in the <110> direction is etched to form conical emitters 72 having a pointed tip. These emitters 72 are formed on substrate 73 in the form of a grid. The substrate is placed in a vacuum of $10^{-7}$ Pa or lower. The substrate is then heated by a heater 75 provided at its back to clean the surface of substrate 73. A crucible 76 and a heater 77 are provided near the emitter 72. A molecular beam 74 of a material used to decrease the work function of CsO or the like is generated by heating to form a surface adsorbed layer on the surface of the emitter 72. A conical anode 71 is provided opposite of the substrate 72 so that their relative positioning can be adjusted. A voltage Ve is applied therebetween. As a result, it is possible to extract a monochromatic high brightness electron beam from a conduction band by selectively applying an electric field to one of the conical emitters. The amount of CsO to be evaporated can be adjusted by controlling the voltage Ve applied between the substrate 73 and the anode 71 and by detecting the increase of a current value. A plurality of emitters 72 are shown because additional emitters are needed as spares if one emitter breaks.

Figure 7B:
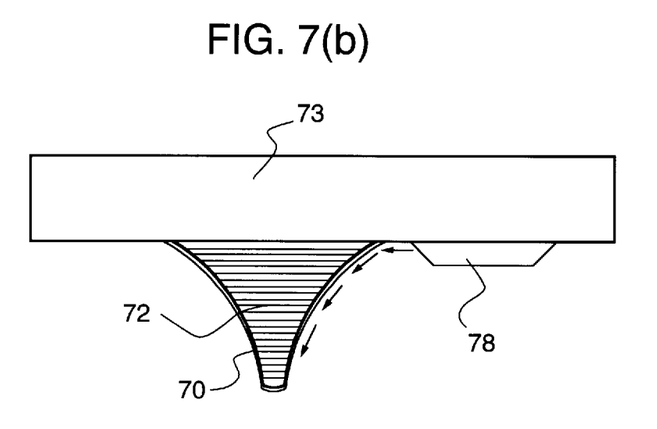

As shown in FIG. 7(b), a source 78 for diffusing material serving as the surface adsorbed layer 70 may be provided instead of the crucible 76 and heater 77 of FIG. 7(a). In the event a source 78 is used, the surface adsorbed layer 70 may be supplied to the surface by heating and diffusing the material as shown in FIG. 7(b).

Just like in the first embodiment, it is possible to deposit a surface passivation layer made of chalcogens such as those described in connection with the first embodiment.

Figure 8:
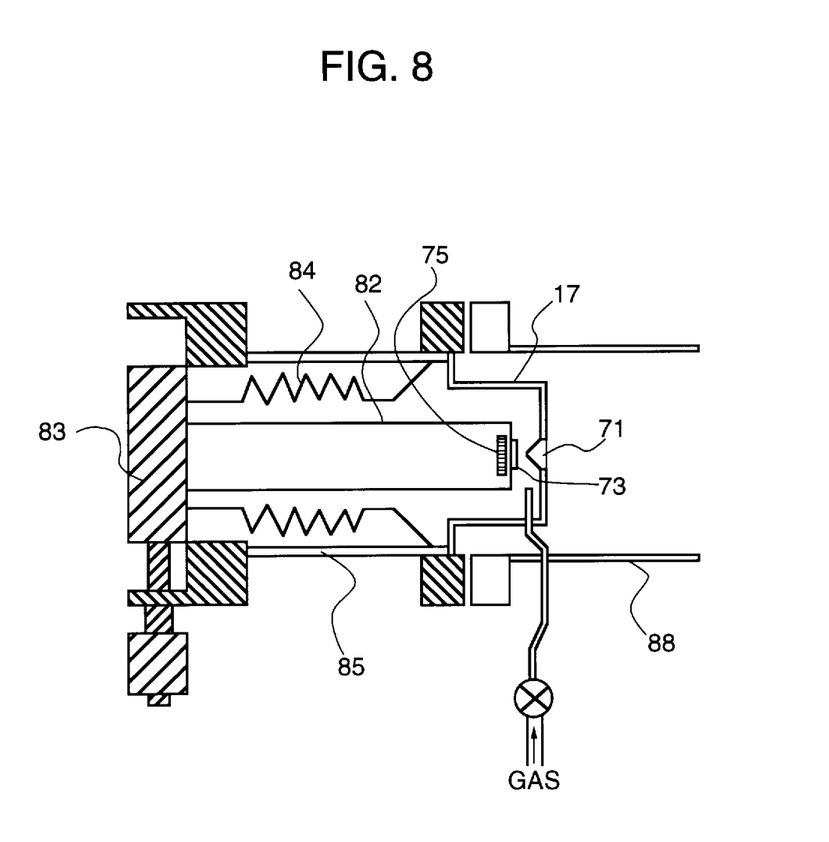
FIG. 8 illustrates a sectional view of the electron beam source apparatus according to the second embodiment of the present invention.

A partial sectional view of the electron beam apparatus used in an electron microscope is shown in FIG. 8. Substrate 73 has an Au-Ge-Ni-W alloy film for ohmic contact at its back and is bonded through heating by holding a thin gold film on a cathode support 82. The cathode support 82 is secured to a horizontal stage 83 and sealed with a bellows 84 so that it can be moved in the X direction from the external atmosphere even if the inside of electron gun assembly 85 is a vacuum. A vacuum chamber is represented by symbol 88.

Anode 71 is secured to anode support 17 so that the projection approaches the electron emitting source of the substrate 73. Heater 75 is set in the cathode support 82 so as to heat an emitter up to between 500° and 600° C. in order to clean the surface. Preferably, hydrogen or oxygen is introduced as the GAS, shown in FIG. 8, at approximately $10^{-5}$ to $10^{-2}$ Pa. Thus, more preferable surface adsorbates are obtained because the amount of Cs supply can be determined through evaporation and the amount of gaseous oxygen supply can independently be determined.

Although a heater is shown for cleaning the substrate surface, a heater is not always necessary. Other methods can be used such as cleaning the surface with a plasma obtained by introducing hydrogen gas, fluorocarbon, or carbon tetrachloride and applying a voltage of hundreds to thousands of volts between the anode and the emitter.

Figure 10:
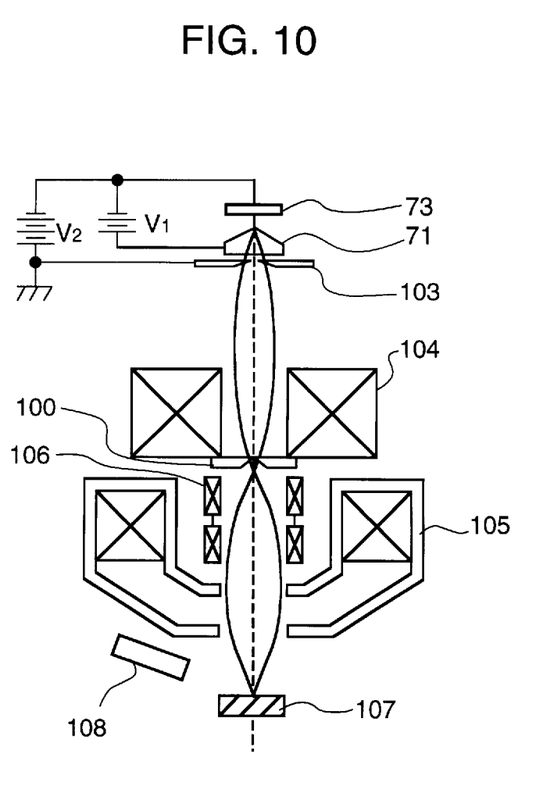
FIG. 10 illustrates a sectional view of an electron beam source apparatus according to a third embodiment of the present invention.

According to the third embodiment of the present invention, an electron beam apparatus is shown in FIG. 10. A voltage $V_1$ (approximately 2.5 kV) is applied to the anode 71 and the substrate 73 having the electron emitting source, in order to cause an electron beam to be emitted. Although the extracting voltage $V_1$ is determined by the distance between the anode and the emitter, it is possible to practically use a voltage that is within the range of 10 V to 10 kV. Then, a second voltage $V_2$ (approximately 100 V) is applied to an acceleration electrode 103 to obtain an electron beam at a desired acceleration voltage. The electron beam passing through the acceleration electrode 103 is narrowed by a condenser lens 104, an aperture 100 and an object lens 105 before irradiating a specimen 107. Secondary electrons that are produced are detected by a secondary-electron detector 108 to obtain an SEM (Scanning Electron Microscope) image by displaying the intensity of the detected signal on a CRT synchronously with a deflection signal. The deflection signal is produced by a deflector 106 which two-dimensionally scans the surface of the specimen 107 with the electron beam. According to the present invention, a monochromatic electron beam with high brightness is obtained so that high resolution is achieved.

Because the electron beam apparatus uses an electron beam having a narrow energy range ($\Delta V$), it is possible to lower the acceleration voltage ($V_2$) without deteriorating the chromatic aberration ($Ac \propto \Delta V/V_2$) proportional to the energy range ($\Delta V$). Thus, it is possible to further improve the performance of the apparatus such as a low-damage critical dimension measurement SEM for obtaining a low-acceleration electron beam (approximately 5 to 700 V, or more preferably, approximately 10 to 500 V). Even if the acceleration voltage ($V_2$) is the same as that of a conventional SEM (which has an acceleration voltage of approximately 800 V to 3 kV) or that of a transmission electron microscope (which has an acceleration voltage of approximately 20 to 2000 kV) because the chromatic aberration (Ac) is small, it is possible to use a lens system with other small aberration coefficients by optimizing the lens system through the chromatic aberration coefficient ($\alpha$-$AcV_2/\Delta V$) is large and therefore, an increased degree of freedom of design results.

In the electron beam apparatus discussed above and shown in FIG. 10, the number of lens and deflectors and their arrangement are not limited to this embodiment. Furthermore, although a scanning electron microscope is described, this electron beam apparatus may also be effectively implemented as an apparatus requiring a monochromatic electron beam such as an electron energy loss spectroscope.

In conclusion, the present invention realizes an electron beam source capable of generating a monochromatic (small energy dispersion) electron beam having high brightness (large current confined in a small area). The beam source of the present invention makes it possible to emit electrons from the conduction band while simultaneously suppressing emission from the valence band. Emiting electrons from the conduction band is made possible by using the n-type materials discussed above or by exciting electrons from the valence band as also discussed above. Suppressing emission of electrons from the valence band is made possible by surface state reduction by using a surface passivation layer and/or a highly doped region. Also, suppression or emission from the valence band can be accomplished by providing a work function that is less than or equal to 2.5 times the band gap Eg.

Furthermore, the present invention also makes it possible to easily manufacture such an electron beam source. An electron beam source apparatus and electron beam apparatus using the electron beam source are also disclosed and form a part of the present invention.

While the present invention has been disclosed above with respect to the preferred embodiments disclosed, one of ordinary skill in the art would be enabled by this disclosure to make various modifications and still be within the scope and spirit of the present invention as defined in the appended claims.

We claim:

1. An electron beam source comprising:
   a needle-shaped structure having a pointed tip with a surface, the surface of the pointed tip being formed of one of a single-crystal semiconductor or single-crystal insulator; and
   electron forming means for forming conduction band electrons near the surface of the pointed tip of the needle-shaped structure, the needle-shaped structure having an n-type impurity doped layer of a concentration exceeding an effective-state density in a conduction band on the surface of the pointed tip of the needle-shaped structure.

2. The electron beam source according to claim 1, wherein the needle-shaped structure is formed from one of a group consisting of group III–V compound semiconductors or group III–V mixed crystals.

3. The electron beam source according to claim 2, wherein a surface state decreasing means is provided on the surface of the pointed tip of the needle-shaped structure in order to lower a surface state in a band gap formed on the surface of the pointed tip of the needle-shaped structure.

4. The electron beam source according to claim 3, wherein the surface state decreasing means is a surface passivation layer.

5. The electron beam source according to claim 4, wherein the surface passivation layer is formed from a group consisting of chalcogens, hydrogen, or a compound of chalcogens and hydrogen.

6. The electron beam source according to claim 5, wherein an amount of an element or compound forming the surface passivation layer is determined so that the number of surface states in a band gap is less than or equal to one per 1,000 surface atoms.

7. The electron beam source according to claim 2, wherein the pointed tip of the needle-shaped structure has at least one additional set of layers, said additional set of layers including a quantum well layer and a barrier layer arranged inside of the quantum well layer.

8. An electron beam source comprising:
   a needle-shaped structure having a pointed tip with a surface, the surface of the pointed tip being formed of one of a single-crystal semiconductor or single-crystal insulator;
   an n-type region formed on at least a part of the needle-shaped structure; and
   a surface passivation layer being formed on the needle-shaped structure so that the number of surface states in a band gap is less than or equal to one per 1,000 surface atoms.

9. An electron beam source comprising:
   a needle-shaped structure having a pointed tip with a surface, the surface of the needle-shaped structure being formed of one of a single-crystal semiconductor or single-crystal insulator; and
   electron forming means for forming conduction band electrons near the surface of the pointed tip of the needle-shaped structure, wherein the electron forming means is an n-type impurity doped layer having a concentration exceeding a surface state density in a band gap formed on the surface of the pointed tip of the needle-shaped structure.

10. The electron beam source according to claim 9, wherein the needle-shaped structure is provided with a surface adsorbed layer made of at least one material selected from a group consisting of Cs, TiO, HfO, ThO, VO, NbO, YO, ScO, MgO, ZrO, AlO, BeO, CeO, CsO, TiN, ZrN, HfN, VN, NbN, YN, MgN, and AlN.

11. The electron beam source according to claim 9, wherein the needle-shaped structure is provided with a surface adsorbed layer made of at least one material selected from a group consisting of Cs, TiO, HfO, ThO, VO, NbO, YO, ScO, MgO, ZrO, AlO, BeO, CeO, CsO, TiN, ZrN, HfN, VN, NbN, YN, MgN, and AlN, wherein the surface adsorbed layer is arranged such that the work function of the surface of the layer is less than or equal to 2.5 times the band gap formed on the surface of the pointed tip of the needle-shaped structure.

12. The electron beam source according to claim 11, wherein the surface adsorbed layer is formed such that the work function of a surface of the layer is at least 1 eV.

13. An electron beam source comprising:
   a needle-shaped structure having a pointed tip with a surface, the surface being formed of one of a single-crystal semiconductor or single-crystal insulator, wherein electrons exist near the surface of the pointed tip of the needle-shaped structure;
   electron forming means for exciting the electrons in a valence band to a conduction band prior to emission, and
   means for supDressina emission of electrons directly from the valence band.

14. The electron beam source according to claim 13, wherein the means for exciting electrons in a valence band is a photoexcitation means.

15. An electron beam source according to claim 13, wherein the means for suppressing emission of electrons includes a surface passivation layer.

16. An electron beam source according to claim 13, wherein the means for suppressing emission of electrons reduces the work function of a surface adsorbed layer.

17. An electron beam source comprising:
   a needle-shaped structure having a pointed tip with a surface, the surface of the pointed tip being formed of one of a single-crystal semiconductor or single-crystal insulator; and
   surface state decreasing means being provided on the surface of the pointed tip of the needle-shaped structure in order to lower a surface state in a band gap formed on the surface of the pointed tip of the needle-shaped structure.

18. The electron beam source according to claim 17, wherein the surface state decreasing means is a surface passivation layer.

19. The electron beam source according to claim 18, wherein the surface passivation layer is formed from a group consisting of chalcogens, hydrogen, or a compound of chalcogens and hydrogen.

20. The electron beam source according to claim 19, wherein an amount of an element or compound forming the surface passivation layer is determined so that the number of surface states in a band gap is less than or equal to one per 1,000 surface atoms.

21. The electron beam source according to claim 17, wherein the surface state decreasing means is a reconstructed layer of surface atoms.

22. The electron beam source according to claim 17, wherein the surface state decreasing means is a reconstructed layer of surface atoms, wherein the needle-shaped structure is formed of a single-crystal semiconductor, and a deviation of a direction of electron emission is within 20° from a line perpendicular to the {110}-plane of the single-crystal semiconductor.

23. The electron beam source according to claim 17, wherein the needle-shaped structure has an n-type impurity doped layer exceeding a surface state density in a band gap formed on the surface of the pointed tip of the needle-shaped structure.

24. An electron beam source comprising:
   a needle-shaped structure having a pointed tip with a surface, the surface of the pointed tip being formed of at least one type of group IV single-crystal semiconductor or mixed crystal of group IV semiconductors and including impurities with a density exceeding an effective-state density in a conduction band.

25. The electron beam source according to claim 24, wherein the surface of the pointed tip is formed of a group IV semiconductor, wherein the group IV semiconductor is Si.

26. A method for manufacturing an electron beam source comprising the steps of:
   providing a needle-shaped structure having a pointed tip with a surface such that the surface of the pointed tip is formed from one of a single-crystal semiconductor or single-crystal insulator, and
   forming a surface passivation layer on the surface of the pointed tip in order to lower a surface state in a band gap existing on the surface of the pointed tip of the needle-shaped structure.

27. The method according to claim 26, wherein the surface passivation layer is formed by performing one of the following steps of dipping the needle-shaped structure in a solution containing an element forming the surface passivation layer, applying a solution to the needle-shaped structure, or evaporating an element forming the surface passivation layer onto the needle-shaped structure.

28. A method according to claim 26, wherein the step of preparing a needle-shaped structure having pointed tip includes the steps of:
   providing a needle-shaped structure being formed of a high-concentration, n-type, single-crystal of GaAs;
   forming a single-crystal GaAs film near the pointed tip of the needle-shaped structure using molecular beam epitaxy (MBE);
   forming a layer of silicon on the single-crystal GaAs film; and
   forming a layer of GaAs on top of the layer of silicon.

29. An electron beam source manufacturing method according to claim 28, wherein the single-crystal GaAs film has thickness of approximately 5 nm and the GaAs layer has a thickness of approximately 2 nm.

30. An electron beam source manufacturing method according to claim 29, wherein the layer of silicon is doped a high-concentration impurity layer with a concentration of $10^{13}/cm^2$.

31. An electron beam source apparatus comprising:
   an electron beam source having a needle-shaped structure having a pointed tip with a surface, the surface of the pointed tip being formed from one of a single-crystal semiconductor or single-crystal insulator, the electron beam source also having electron forming means for forming conduction band electrons near the surface of the pointed tip of the needle-shaped structure, wherein the electron forming means is an n-type impurity doped layer having a concentration exceeding a surface state density in a band gap formed on the surface of the pointed tip of the needle-shaped structure;
   a positive electrode positioned opposite to the electron beam source; and
   means for applying a negative voltage to the electron beam source with respect to the positive electrode in order to emit electrons from a conduction band of the electron beam source into a vacuum.

32. An electron beam apparatus according to claim 31, further comprising means for supplying a material for forming a surface adsorbed layer on the needle-shaped structure.

33. An electron beam source apparatus according to claim 31, wherein the electron beam source is placed in a vacuum atmosphere of less than or equal to $10^{-7}$ Pa.

34. An electron beam apparatus comprising the electron beam source apparatus of claim 31, and further comprising an acceleration electrode for accelerating electrons emitted from the electron beam source apparatus, and at least one control electrode for controlling the accelerated electrons.

35. An electron beam apparatus comprising the electron beam source apparatus of claim 31, and further comprising an acceleration electrode for accelerating electrons emitted from the electron beam source apparatus, and at least one control electrode for controlling the accelerated electrons, wherein a voltage of 5 to 700 V is applied to the acceleration electrode.

36. An electron beam source apparatus comprising:
   an electron beam source having a needle-shaped structure having a pointed tip with a surface, the surface of the pointed tip being formed from one of a single-crystal semiconductor or single-crystal insulator, the electron beam source also having electron forming means for forming conduction band electrons nearby the surface of the pointed tip of the needle-shaped structure, wherein the electron forming means is a means for exciting electrons in a valence band to a conduction band prior to emission;

means for suppressing emission of electrons directly from the valence band;

a positive electrode positioned opposite to the electron beam source; and means for applying a negative voltage to the electron beam source with respect to the positive electrode in order to emit electrons from a conduction band of the electron beam source into a vacuum.

37. An electron beam source apparatus comprising:

an electron beam source having a needle-shaped structure having a pointed tip with a surface, the surface of the pointed tip being formed from one of a single-crystal semiconductor or single-crystal insulator, the electron beam source also having surface state decreasing means provided on the surface of the pointed tip of the needle-shaped structure in order to lower a surface state in a band gap formed on the surface of the pointed tip of the needle-shaped structure, and electron forming means for forming conduction band electrons near the surface of the pointed tip of the needle-shaped structure, wherein the electron forming means is an n-type impurity doped layer;

a positive electrode positioned opposite to the electron beam source; and means for applying a negative voltage to the electron beam source with respect to the positive electrode in order to emit electrons from a conduction band of the electron beam source into a vacuum.

* * * * *